United States Patent
Campiglio et al.

(10) Patent No.: US 11,217,626 B2
(45) Date of Patent: Jan. 4, 2022

(54) DUAL TUNNEL MAGNETORESISTANCE (TMR) ELEMENT STRUCTURE

(71) Applicant: Allegro MicroSystems, LLC, Manchester, NH (US)

(72) Inventors: Paolo Campiglio, Arcueil (FR); Amal Hamdache, Limours (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/684,932

(22) Filed: Nov. 15, 2019

(65) Prior Publication Data

US 2021/0066391 A1   Mar. 4, 2021

Related U.S. Application Data

(63) Continuation-in-part of application No. 16/574,419, filed on Sep. 18, 2019, now Pat. No. 11,127,518.

(60) Provisional application No. 62/894,114, filed on Aug. 30, 2019.

(51) Int. Cl.
```
G01R 33/09    (2006.01)
H01F 10/32    (2006.01)
H01L 27/22    (2006.01)
H01L 43/02    (2006.01)
H01L 43/08    (2006.01)
```
(Continued)

(52) U.S. Cl.
CPC ............ *H01L 27/22* (2013.01); *G01R 33/098* (2013.01); *H01F 10/3268* (2013.01); *H01L 43/02* (2013.01); *H01L 43/08* (2013.01); *H01L 43/10* (2013.01); *B82Y 25/00* (2013.01)

(58) Field of Classification Search
CPC ......... H01L 27/22; H01L 43/02; H01L 43/08; H01L 43/10; H01F 10/3268; H01F 10/3272; H01F 10/3263; G01R 33/098; B82Y 25/00
See application file for complete search history.

(56) References Cited

U.S. PATENT DOCUMENTS

```
6,473,275 B1   10/2002   Gill
6,937,497 B1    8/2005   Ju et al.
9,741,372 B1*   8/2017   Campiglio ............. H01L 43/12
```
(Continued)

FOREIGN PATENT DOCUMENTS

```
DE   10 2006 010 652 A1   9/2007
EP       2 880 665 A1     6/2015
```
(Continued)

OTHER PUBLICATIONS

Final Office Action dated May 5, 2021 for U.S. Appl. No. 16/047,342; 15 pages.

(Continued)

*Primary Examiner* — Daniel J. Schleis
*Assistant Examiner* — Kevin C T Li
(74) *Attorney, Agent, or Firm* — Daly, Crowley, Mofford & Durkee, LLP (57) ABSTRACT

In one aspect, a dual tunnel magnetoresistance (TMR) element structure includes a first TMR element and a second TMR element. The TMR element structure also includes a conducting layer that is disposed between the first TMR element and the second TMR element and is in direct contact with the first TMR element and the second TMR element.

27 Claims, 10 Drawing Sheets

Prior Art (51) Int. Cl.
*H01L 43/10* (2006.01)
*B82Y 25/00* (2011.01)

(56) References Cited

U.S. PATENT DOCUMENTS

| | | | |
|---|---|---|---|
| 9,812,637 | B2 | 11/2017 | Fermon et al. |
| 10,509,058 | B2 | 12/2019 | Cadugan et al. |
| 2002/0054463 | A1 | 5/2002 | Mukoyama et al. |
| 2003/0031894 | A1 | 2/2003 | Lin et al. |
| 2003/0184918 | A1 | 10/2003 | Lin et al. |
| 2006/0152859 | A1 | 7/2006 | Childress et al. |
| 2006/0267056 | A1 | 11/2006 | Ju et al. |
| 2007/0063237 | A1 | 3/2007 | Huai et al. |
| 2007/0243118 | A1* | 10/2007 | Rousseaux ........... B01D 21/267 423/121 |
| 2007/0253118 | A1 | 11/2007 | Hayakawa et al. |
| 2010/0327857 | A1 | 12/2010 | Hoshiya et al. |
| 2011/0062537 | A1 | 3/2011 | Oh et al. |
| 2011/0163739 | A1 | 7/2011 | Ono et al. |
| 2011/0169488 | A1 | 7/2011 | Mather |
| 2012/0070695 | A1 | 3/2012 | Kitagawa et al. |
| 2012/0112741 | A1 | 5/2012 | Meguro et al. |
| 2012/0280336 | A1* | 11/2012 | Jan ........................ H01L 43/12 257/421 |
| 2014/0110803 | A1 | 4/2014 | Apalkov et al. |
| 2015/0194597 | A1 | 7/2015 | Fermon et al. |
| 2016/0161574 | A1 | 6/2016 | Zimmer |
| 2016/0204341 | A1 | 7/2016 | Gan et al. |
| 2018/0074016 | A1 | 3/2018 | Chen et al. |
| 2018/0335484 | A1 | 11/2018 | Campiglio et al. |
| 2018/0335486 | A1 | 11/2018 | Lassalle-Balier et al. |
| 2019/0051822 | A1 | 2/2019 | Chatterjee et al. |
| 2019/0219643 | A1 | 7/2019 | Cadugan et al. |
| 2020/0018780 | A1 | 1/2020 | Cadugan et al. |
| 2020/0033424 | A1 | 1/2020 | Campiglio et al. |

FOREIGN PATENT DOCUMENTS

| | | |
|---|---|---|
| EP | 3 288 091 A1 | 2/2018 |
| JP | 2010-080008 A | 4/2010 |
| TW | 2014-36316 A | 9/2014 |
| WO | WO 2005/020242 A2 | 3/2005 |
| WO | WO 2016/196157 A1 | 12/2016 |

OTHER PUBLICATIONS

Response to Office Action filed on Dec. 29, 2020 for U.S. Appl. No. 16/047,342; 14 pages.
Notice of Allowance dated Jun. 11, 2021 for U.S. Appl. No. 16/574,419; 13 Pages.
PCT International Preliminary Report dated Feb. 11, 2021 for International Application No. PCT/US2019/037629; 8 Pages.
Response to Restriction Requirement filed on Jun. 24, 2020 for U.S. Appl. No. 16/047,342; 1 page.
Response to U.S. Non-Final Office Action dated Mar. 8, 2021 for U.S. Appl. No. 16/574,419; Response Filed Apr. 5, 2021; 9 Pages.
Advisory Action dated Jul. 15, 2021 for U.S. Appl. No. 16/047,342; 2 Pages.
U.S. Appl. No. 16/157,313, filed Oct. 11, 2018, Lassalle-Balier et al.
U.S. Appl. No. 16/157,317, filed Oct. 11, 2018, Lassalle-Balier et al.
U.S. Appl. No. 16/280,199, filed Feb. 20, 2019, Liu et al.
U.S. Appl. No. 16/507,552, filed Jul. 10, 2019, Lassalle-Balier et al.
U.S. Non-Final Office Action dated Apr. 14, 2017 for U.S. Appl. No. 15/165,322; 24 Pages.
Response to U.S. Non-Final Office Action dated Apr. 14, 2017 for U.S. Appl. No. 15/165,322; Response filed May 30, 2017; 23 Pages.
U.S. Notice of Allowance dated Jul. 14, 2017 for U.S. Appl. No. 15/165,322; 14 Pages.

PCT International Search Report and Written Opinion dated Aug. 10, 2016 for International Application No. PCT/US2016/034237; 21 Pages.
PCT International Preliminary Report dated Dec. 14, 2017 for International Application No. PCT/US2016/034237; 16 Pages.
European 161/162 Communication dated Jan. 30, 2018 for European Application No. 16728493.4; 3 Pages.
Response to European 161/162 Communication dated Jan. 30, 2018 for European Application No. 16728493.4; Response filed Aug. 8, 2018; 13 Pages.
European Examination Report dated Sep. 2, 2019 for European Application No. 16728493.4; 5 Pages.
Response (with Amended Claims) to European Examination Report dated Sep. 2, 2019 for European Application No. 16728493.4; Response filed Jan. 13, 2020; 12 Pages.
Taiwan Office Action (with English Translation) dated Feb. 16, 2017 for Taiwan Application No. 105117391; 19 Pages.
Response (with Amended Claims in English) to Taiwan Office Action dated Feb. 16, 2017 for Taiwan Application No. 105117391; Response filed May 4, 2017; 25 Pages.
Taiwan Allowance Decision (with English Reporting E-mail) dated Oct. 31, 2017 for Taiwan Application No. 105117391; 4 Pages.
Japanese Voluntary Amendment (with Amended Claims in English) filed on May 21, 2019 for Japanese Application No. 2017-563135; 16 Pages.
PCT International Search Report and Written Opinion dated Sep. 26, 2019 for International Application No. PCT/US2019/037629; 13 Pages.
Yuan et al., "Double-Pinned Magnetic Tunnel Junction Sensors with Spin-Valve-Like Sensing Layers;" Journal of Applied Physics, vol. 118; Published on Aug. 4, 2015; 4 Pages.
Zhang et al., "Large Perpendicular Exchange Bias in CoFeB/MgO Systems Pinned by a Bottom IrMn Layer via an Interfacial CoFe/Ta Composite Layer;" IEEE Transactions on Magnetics, vol. 51, No. 11; Nov. 2015; 4 Pages.
Extended European Search Report dated Jan. 22, 2021 for European Application No. 20192931.2; 11 Pages.
U.S. Restriction Requirement dated May 8, 2020 for U.S. Appl. No. 16/047,342; 6 Pages.
U.S. Appl. No. 16/574,419, filed Sep. 18, 2019, Campiglio et al.
Yu et al., "Perpendicular Magnetic Tunnel Junctions with a Thin FeTa Insertion Layer for 400° C. Thermal Stability;" Applied Physics Express, vol. 11, No. 1; Published Online Dec. 13, 2017; 4 Pages.
Yuasa, "Giant TMR Effect in CoFeB/MgO/CoFeB MTJs;" Section 11.5.2 from Chapter 11 (Tunneling Magnetoresistance in MgO-Based Magnetic Tunnel Junctions Experiment) in the book entitled *Handbook of Spin Transport and Magnetism* by Evgeny Y. Tsymbal and Igor Zutic; Published Aug. 25, 2011; pp. 224-225; 1 Page.
U.S. Non-Final Office Action dated Mar. 8, 2021 for U.S. Appl. No. 16/574,419; 22 Pages.
Response to U.S. Final Office Action dated May 5, 2021 for U.S. Appl. No. 16/047,342; Response filed Jul. 2, 2021; 15 Pages.
Office Action dated Oct. 14, 2020 for U.S. Appl. No. 16/047,342; 10 pages.
312 Amendment filed on Jul. 16, 2021 for U.S. Appl. No. 16/574,419; 5 Pages.
U.S. Preliminary Amendment filed on Aug. 26, 2021 for U.S. Appl. No. 16/047,342; 10 Pages.
U.S. Appl. No. 17/405,490, filed Aug. 18, 2021, Campiglio et al..
U.S. Notice of Allowance dated Oct. 1, 2021 for U.S. Appl. No. 16/047,342; 11 Pages.
Response (with Amended Claims) to European Communication dated Mar. 10, 2021 for European Application No. 19735086.1; Response filed Sep. 14, 2021; 27 Pages.
Response (with Amended Claims) to European Communication dated Mar. 9, 2021 for European Application No. 20192931.2; Response filed Sep. 1, 2021; 26 Pages.

* cited by examiner

DUAL TUNNEL MAGNETORESISTANCE (TMR) ELEMENT STRUCTURE

RELATED APPLICATIONS

This application is a continuation-in-part of application to U.S. application Ser. No. 16/574,419, filed Sep. 18, 2019 and titled "TUNNEL MAGNETORESISTANCE (TMR) ELEMENT HAVING COBALT IRON AND TANTALUM LAYERS," which claims the benefit of U.S. Provisional Application No. 62/894,114, filed Aug. 30, 2019, and entitled "TUNNEL MAGNETORESISTANCE (TMR) ELEMENT HAVING COBALT IRON AND TANTALUM LAYERS," which is incorporated herein by reference in its entirety.

BACKGROUND

Magnesium oxide (MgO) magnetic tunnel junctions (MTJs) are widely used spintronics materials due to their high magneto-resistance ratio (MR %). The reason for this high ratio is due to the so-called coherent tunneling mechanism through the MgO barrier which filters in only highly-spin polarized electronic states. When compared with similar giant magnetoresistance (GMR) structures, MTJs generally show lower reference stability (lower spin flop field) and higher free layer anisotropy (higher coercivity).

SUMMARY

In one aspect, a dual tunnel magnetoresistance (TMR) element structure includes a first TMR element and a second TMR element. The TMR element structure also includes a conducting layer that is disposed between the first TMR element and the second TMR element and is in direct contact with the first TMR element and the second TMR element.

In another aspect, a magnetic field sensor includes at least one dual tunnel magnetoresistance (TMR) element structure that includes a first TMR element, a second TMR element and a conducting layer disposed between the first TMR element and the second TMR element and in direct contact with the first TMR element and the second TMR element.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a double pinned dual tunneling magnetoresistance (TMR) element structure, which does not share any layers between two TMR elements; but rather, stacking the two TMR elements of the dual TMR element structure one on the top of the other and separating the two TMR elements by a conductive layer. With this approach, the two TMR elements have a similar stack construction, notably placing the reference layer on the bottom and thus providing good reference layer stability against an external field. The behavior of the two TMR elements can be designed to achieve a desired sensitivity response to a magnetic field and mixed together once the stack is etched (thus placing the two TMR elements in series). For example, one TMR element may be used to compensate the behavior of the other TMR element (e.g., the sensitivity of one TMR element decreases, the sensitivity of the other TMR element increases). In another example, different sensitivity behaviors may be mixed (e.g., a piecewise response: high sensitivity in a low-field range with some linearity also in a medium-field range).

Figure 1:
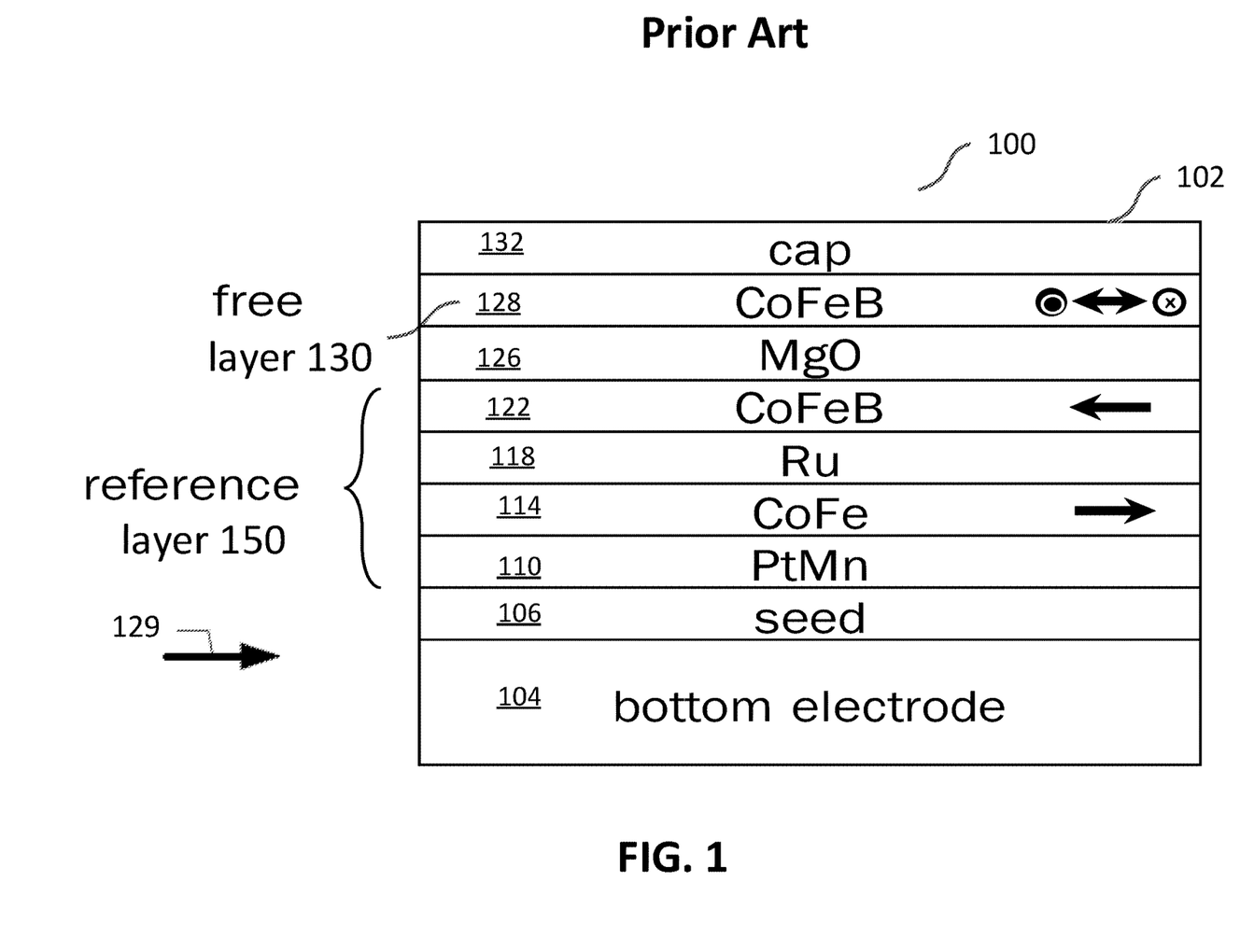
FIG. 1 is a block diagram of a prior art example of a tunneling magnetoresistance (TMR) element.

Referring to FIG. 1, an illustrative TMR element 100 can have a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 includes platinum manganese (PtMn) or iridium manganese (IrMn), for example. The layer 114 is located on the layer 110 and the layer 118 is located on the layer 114. In one example, the layer 114 includes cobalt iron (CoFe) and the layer 118 is a spacer layer and includes ruthenium (Ru). On the layer 118, a magnesium oxide (MgO) layer 126 is sandwiched between two cobalt iron boron (CoFeB) layers 122, 128. A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 includes the CoFeB layer 128. In some examples, the free layer 130 may include an additional layer of nickel iron (NiFe) (not shown) and a thin layer of tantalum (not shown) between the CoFeB layer 128 and the NiFe layer.

It will be understood that a driving current running through the TMR element 100 runs through the layers of the stack, running between seed and cap layers 106 and 132, i.e., perpendicular to a surface of a bottom electrode 104. The TMR element 100 can have a maximum response axis that is parallel to the surface of the bottom electrode 104 and that is in a direction 129, and also parallel to the magnetization direction of the reference layer 150, comprised of layers 110, 114, 118, and 122, most notably in the layer CoFeB 122.

The TMR element 100 has a maximum response axis (maximum response to external fields) aligned with the arrow 129, i.e., perpendicular to bias directions experienced by the free layer 130, and parallel to magnetic fields of the reference layer 150, notably pinned layer 122. Also, in general, it is rotations of the magnetic direction of the free layer 130 caused by external magnetic fields that result in changes of resistance of the TMR element 100, which may be due to a change in angle or a change in amplitude if an external bias is present because the sum vector of the external field and the bias is causing a change in the angle between the reference and free layers.

The coherent tunneling mechanism through a magnesium oxide (MgO) barrier (the layer 126) is due to symmetry factors and, as such, it is essential that the MgO barrier and the neighboring CoFeB layers 122, 128 crystallize in a cubic, epitaxial fashion. On the other hand, the non-active part of the MTJs is based on the hexagonal symmetry typical of the (111) plane of face-centered cubic structures. Thus, inserting cubic CoFeB/MgO/CoFeB layers 122, 126, 128 in a hexagonal multilayer must be performed carefully in order not to degrade the response typical of a full-hexagonal system (e.g., a giant magnetoresistance (GMR)).

In the reference layer 150, the main problem of the cubic structure comes from the fact that CoFeB layer 122 is coupled with another CoFe layer 114 through the Ru spacer layer 118. The different crystal symmetry makes this coupling less effective than in an all-hexagonal structure.

Figure 2:
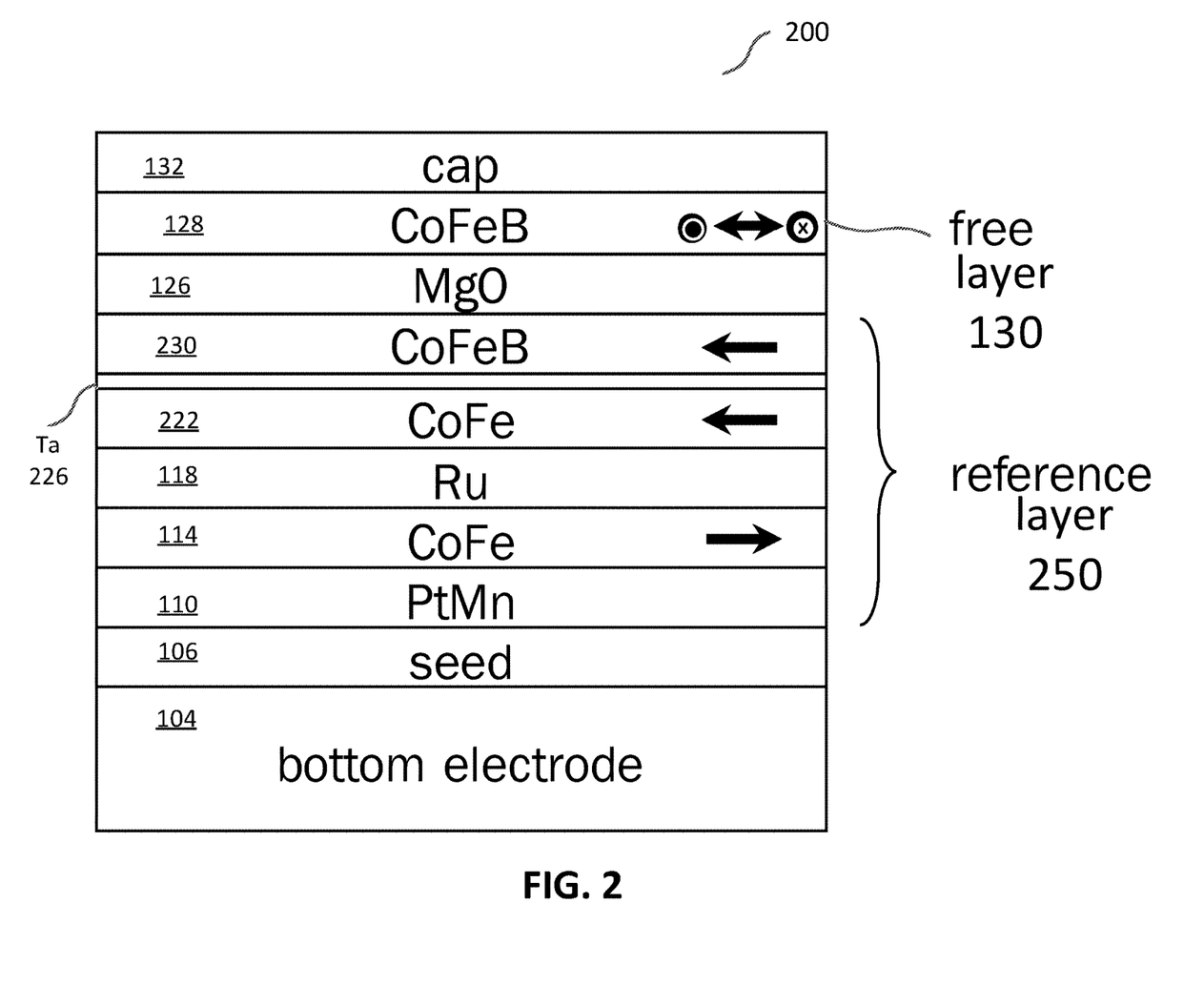
FIG. 2 is a block diagram of an example of a TMR element with a reference layer having a cobalt iron (CoFe) layer and a tantalum layer.

Referring to FIG. 2, to circumvent the difference in crystal symmetry in TMR element 100 (FIG. 1), a TMR element 200 replaces the CoFeB layer 122 (FIG. 2) with a tri-layer that includes a CoFe layer 222, a Ta layer 226 and a CoFeB layer 230. The layers 122, 230 are separated with a thin Ta spacer, which is thin enough to decouple the crystal structures without breaking the ferromagnetic coupling between CoFe and CoFeB. A reference layer 250 includes layers 110, 114, 118, 222, 226, 230.

In one example, the CoFe layer 222 and the CoFeB layer 230 are each about 0.9 nanometers thick. In one example, the Ta layer 226 is about 0.1 nanometers thick. In another example, the Ta layer 226 ranges from 0.05 nanometers to 0.3 nanometers.

Figure 3:
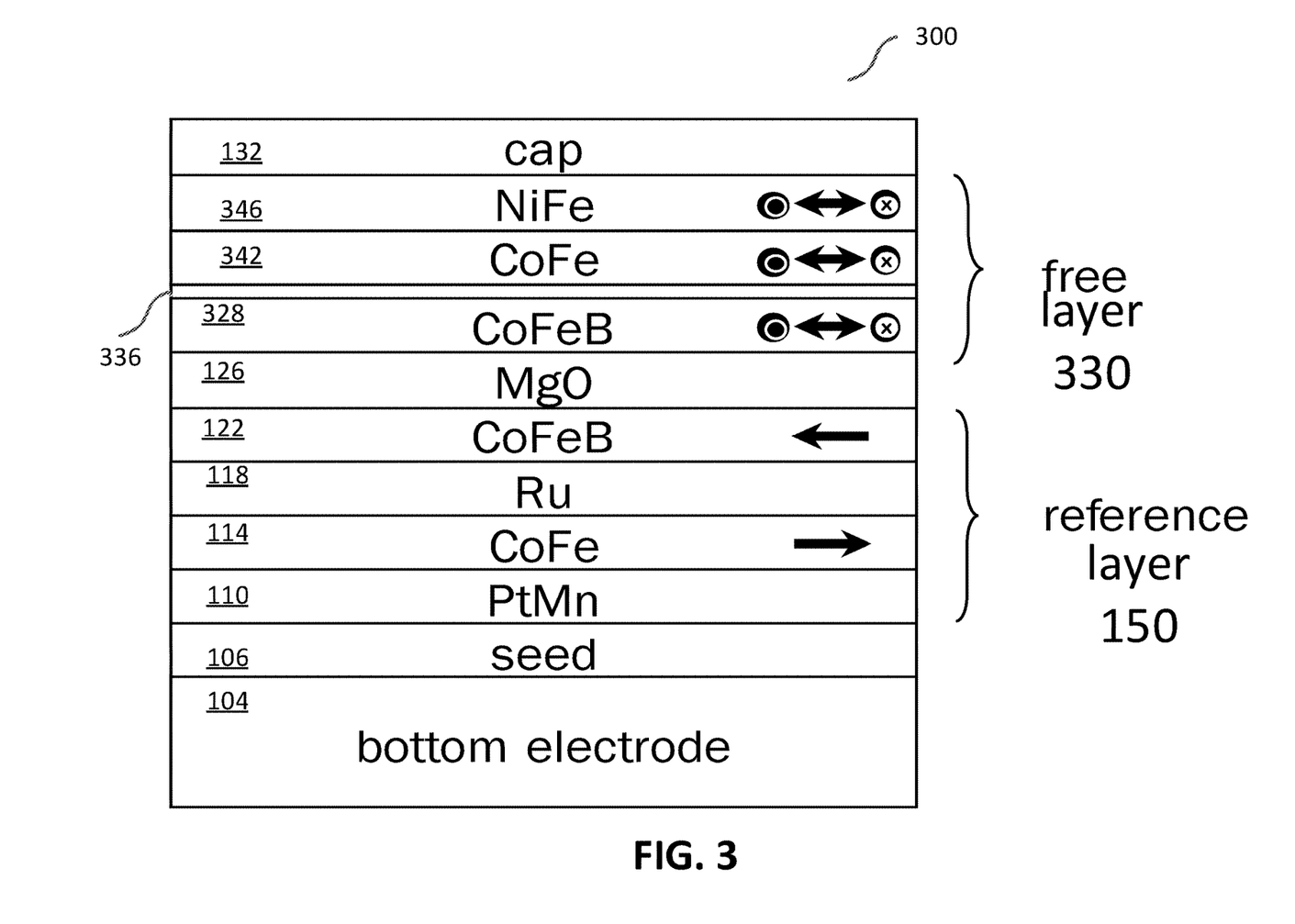
FIG. 3 is a block diagram of another example of a TMR element with a free layer having the cobalt iron (CoFe) layer and the tantalum layer.

Referring to FIGS. 1 and 3, in the free layer 130, the cubic structure of the CoFeB layer 128 causes a higher coercivity in a response. To reduce the coercivity, a TMR element 300 replaces the CoFeB layer 128 with a quad-layer that includes a CoFeB layer 328, a Ta layer 336, a CoFe layer 342 and a nickel iron (NiFe) 346 to form a free layer 330. In particular, the thickness of CoFeB 328 is reduced from the CoFeB layer 128 as much as possible to maintain a good epitaxial structure in the active area. For example, the CoFeB layer 128 is about 2.5 nanometers thick while the CoFeB 328 is about 1.0 nanometers thick. The CoFe 342 coupled with a magnetically softer material of the NiFe layer 346 helps the rotation of the CoFeB 328 by reducing coercivity. In one example, the CoFe layer 342 is about 1.0 nanometers thick. In one example, the Ta layer 336 is about 0.1 nanometers thick. In another example, the Ta layer 336 ranges from 0.05 nanometers to 0.3 nanometers.

Figure 4:
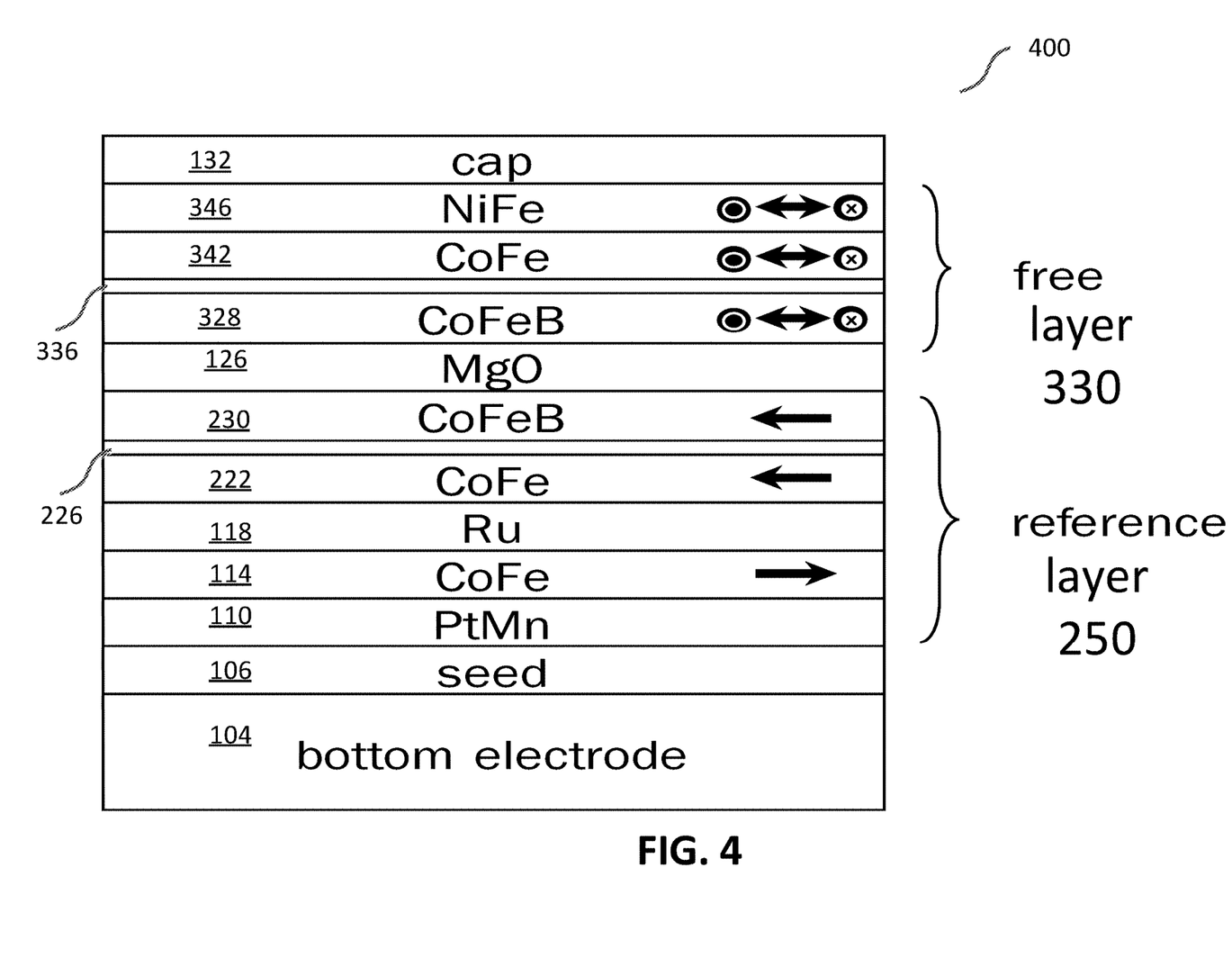
FIG. 4 is a block diagram of a further example of a TMR element with the reference layer and the free layer each having the cobalt iron (CoFe) layer and the tantalum layer.

Referring to FIG. 4, both CoFeB layers 122, 128 (FIG. 1) may also be replaced. For example, a TMR element 400 includes the reference layer 250 of FIG. 2 and the free layer 330 of FIG. 3.

Figure 5:
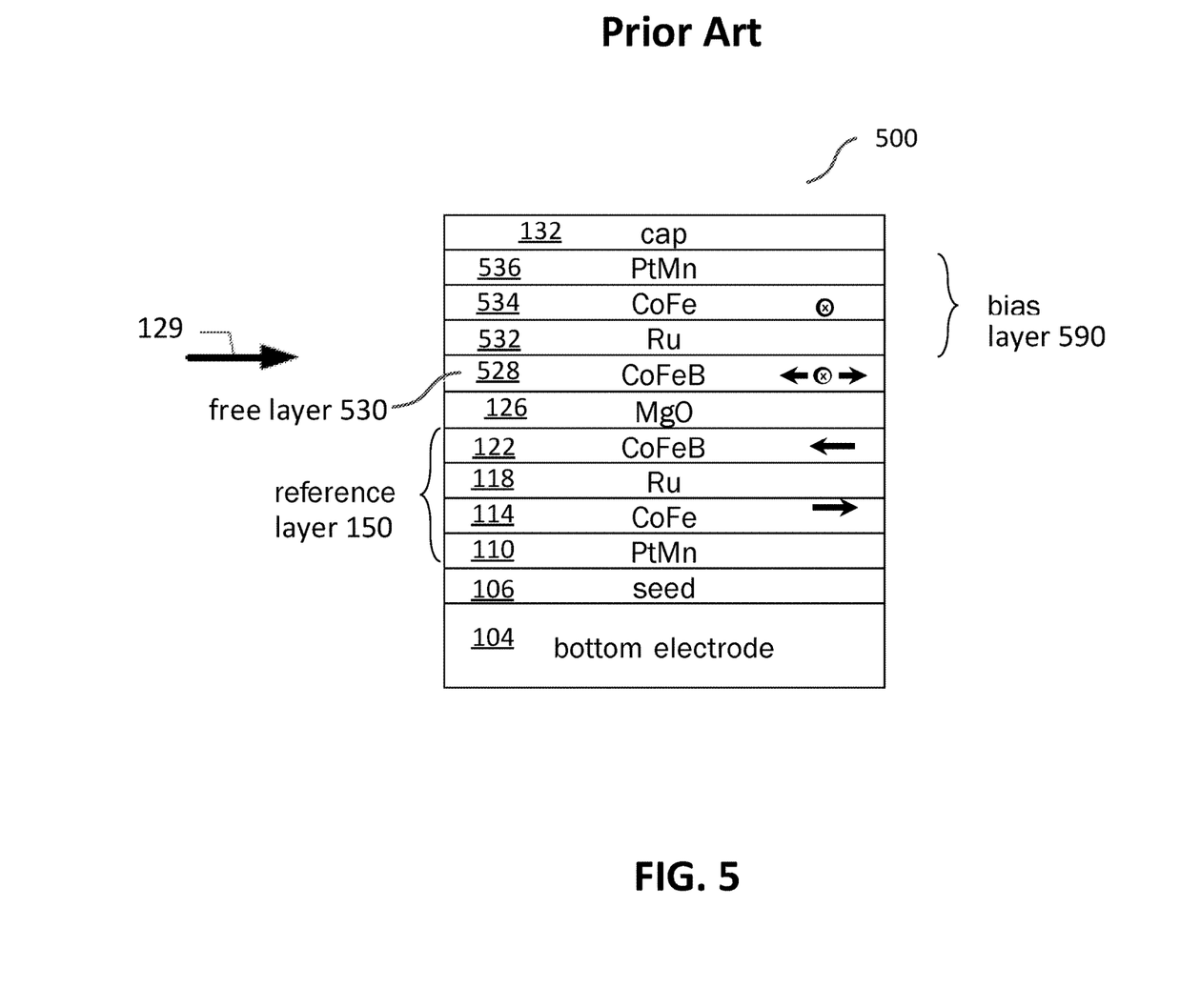
FIG. 5 is a block diagram of a prior art example of a TMR element that is double pinned.

Referring to FIG. 5, a TMR element 500 is the same as TMR element 100 (FIG. 1) except, for example, the TMR includes a bias layer 590. The CoFeB 528 forms a free layer 530. The bias layer 590 includes a Ru layer 532 located on the CoFeB layer 528, a CoFe layer located on the Ru layer 532 and a PtMn layer 536 located on the CoFe layer 534.

The TMR element 500 is double pinned, i.e., it has two pinning layers 536, 110. A pinned layer structure 534, 532, 528 is magnetically coupled to the pinning layer 536. The single layer pinned layer 114 is magnetically coupled to the pinning layer 110. With zero external magnetic field, the free layer 530 takes on a magnetic alignment parallel to the bias layer 590, with direction (ferromagnetic or antiferromagnetic coupling) determined by thickness and material of the spacer layer 532. Thus, double pinned means that the free layer 530 is stabilized by intra-stack bias from the bias layer 590. The free layer 530 may go parallel or antiparallel to the reference layer 150 depending on the direction of the external field 129.

Figure 6:
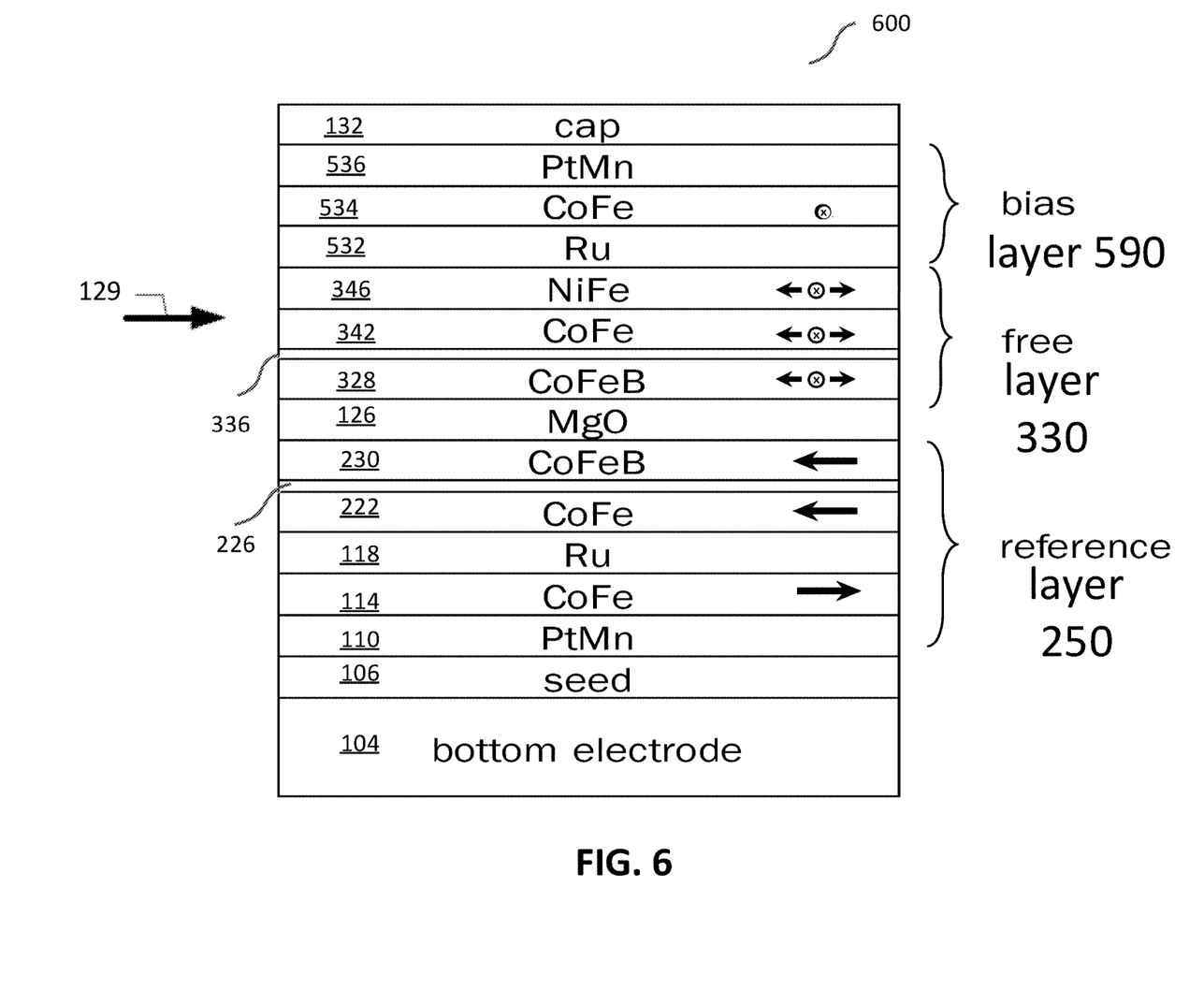
FIG. 6 is a block diagram of a still further example of a TMR element that is double pinned with the reference layer and the free layer each having the cobalt iron (CoFe) layer and the tantalum layer.

Referring to FIG. 6, the techniques described in FIGS. 2 to 4 may also be applied to the TMR element 500 (FIG. 5). For example, in a TMR element 600, the free layer 530 (FIG. 5) is replaced with the free layer 330 and the reference layer 150 (FIG. 5) is replaced with the reference layer 250.

Figure 7:
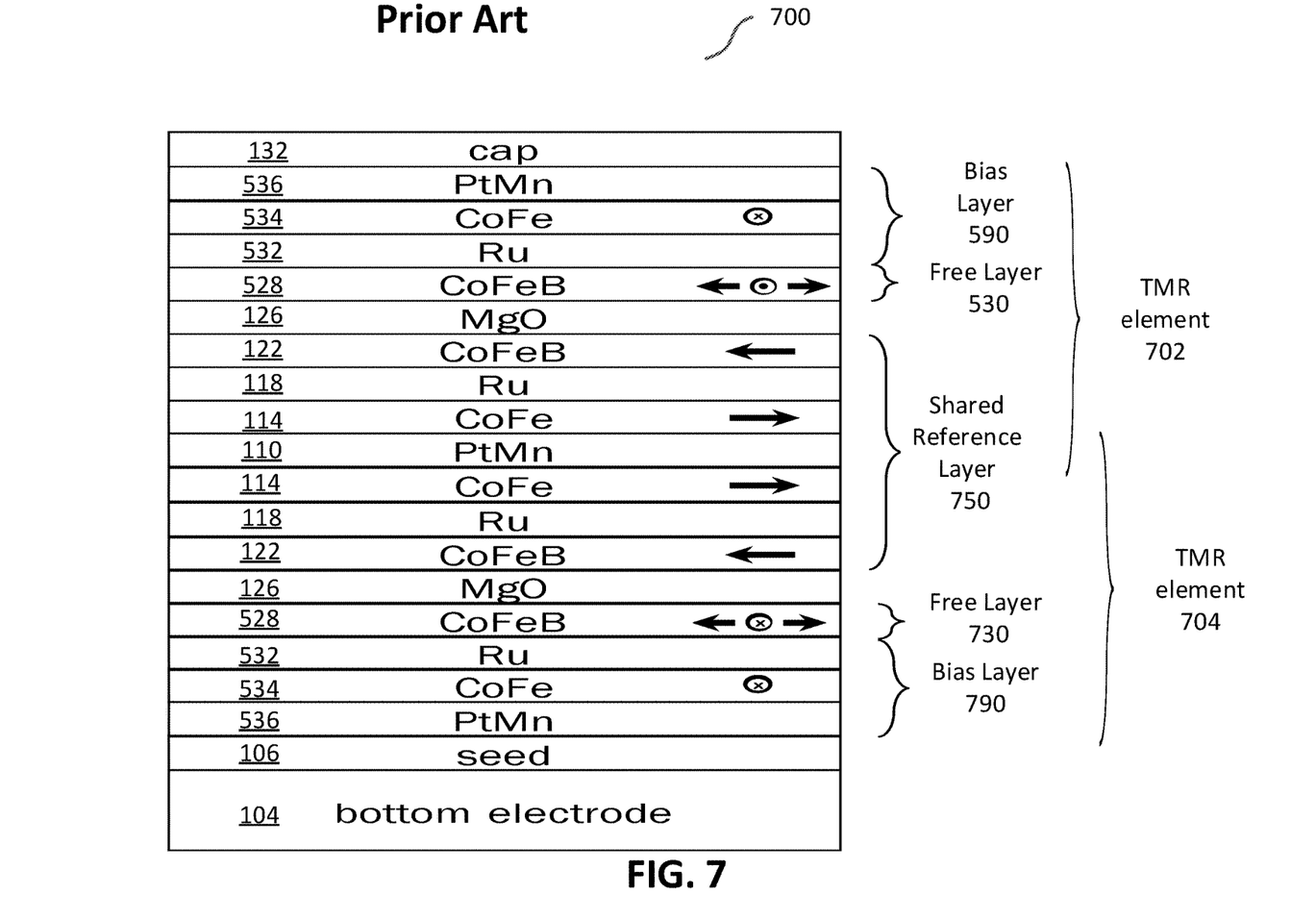
FIG. 7 is a block diagram of a prior art example of a dual TMR element structure having a shared reference layer.

Referring to FIG. 7, a dual TMR element structure 700 includes a TMR element 702 and a TMR element 704. The TMR elements 702, 704 share a reference layer 750, which includes layers 122, 118, 114, 110, 114, 118, 122. The TMR element 702 also includes the free layer 530 and the bias layer 590. The TMR element 704 also includes the free layer 730 and the bias layer 790. The free layer 730 is substantially the same as the free layer 530 and includes the layer 528. The bias layer 730 is substantially the same as the bias layer 530 and includes the layers 536, 534, 532; however, the bias layer 730 is inverted with respect to the bias layer 530. In this configuration, the TMR element 704 is a mirror of the TMR element 702 (i.e. the TMR element is inverted with respect to the TMR element 704). The dual TMR element structure 700 is difficult to produce since the TMR element 702 does not respond the same as the TMR element 704 to magnetic fields.

Figure 8:
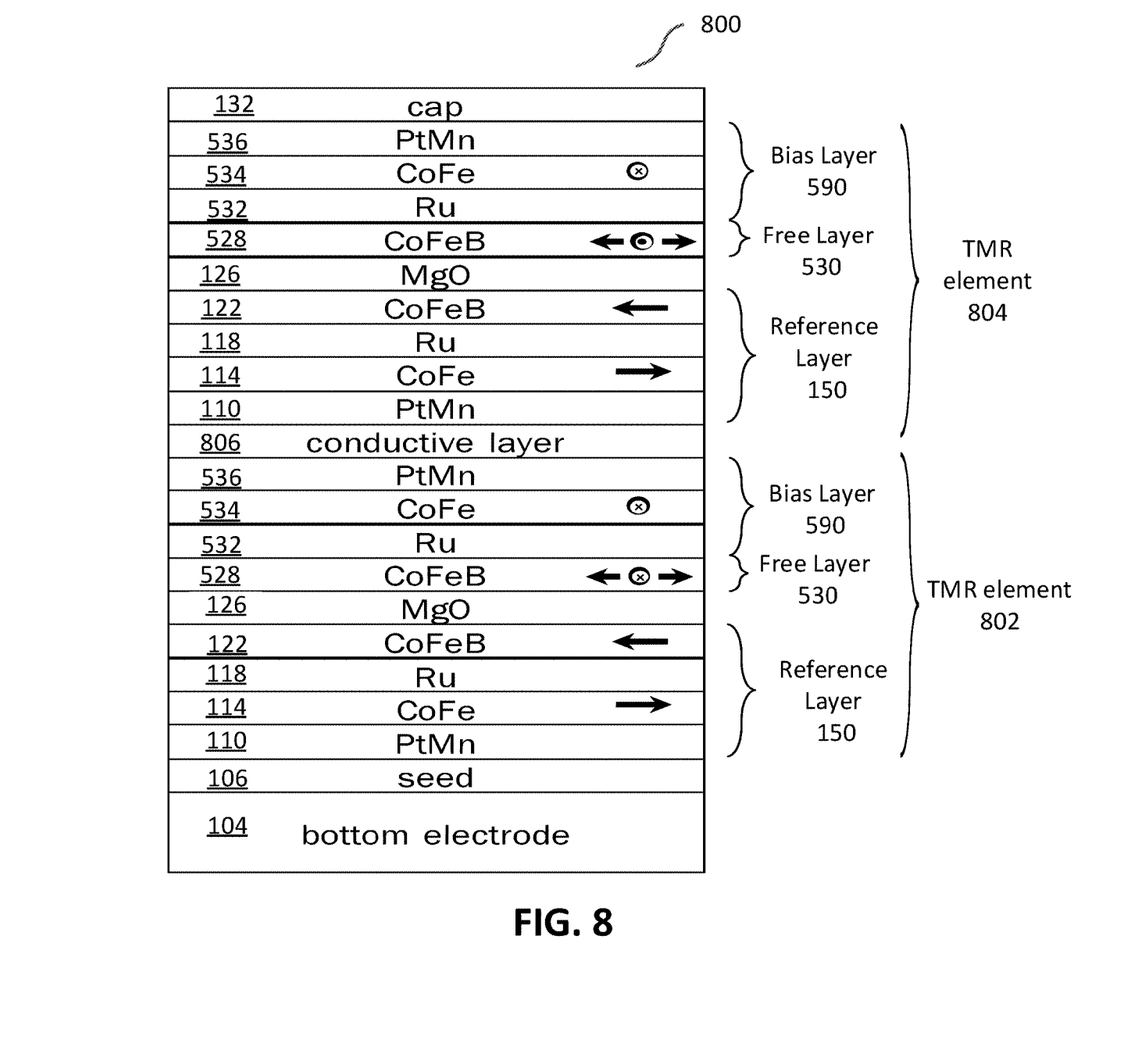
FIG. 8 is a block diagram of an example of a dual TMR element structure having a conducting layer.

Referring to FIG. 8, a dual TMR element structure 800 includes a TMR element 804 on top of a TMR element 802 and separated from the TMR element 802 by a conductive layer 806. The TMR element 802 and the TMR element 804 are substantially the same with no inversion of layers as described with respect to TMR elements 702, 704 (FIG. 7).

The TMR elements 802, 804 each include the bias layer 590 on the top, the free layer 530 in the middle and the reference layer 150 on the bottom. The conductive layer 806 may include at least one of a tantalum, Ruthenium, copper or other metals. In one particular example, the conductive layer 806 is about 5 nanometers. In other examples, the conductive layer may be between 1 nanometer and 50 nanometers.

In this configuration, the TMR elements 802, 804 have a better symmetrical response to changes in the magnetic field than the TMR elements 702, 704 in the dual TMR element structure 700.

The TMR element 802 is double pinned, i.e., it has two pinning layers 536, 110 and the TMR element 804 is double pinned. In other examples, one or both of the TMR elements may be single pinned.

In one example, the TMR elements 802, 804 have the same bias amplitude but have an opposite bias direction from each other, which results in a more symmetrical response to a magnetic field. For example, this may be obtained by selecting an appropriate thickness of layer 532 (e.g., the thickness of the Ru may be used to change both amplitude and direction of bias).

In another example, the TMR elements 802, 804 have a different sensitivity to a magnetic field which may be used to achieve a piecewise response as described in U.S. application Ser. No. 15/600,186 filed May 19, 2017 entitled "Magnetoresistance Element With Increased Operational Range" and assigned to the same entity as this patent application.

Figure 9:
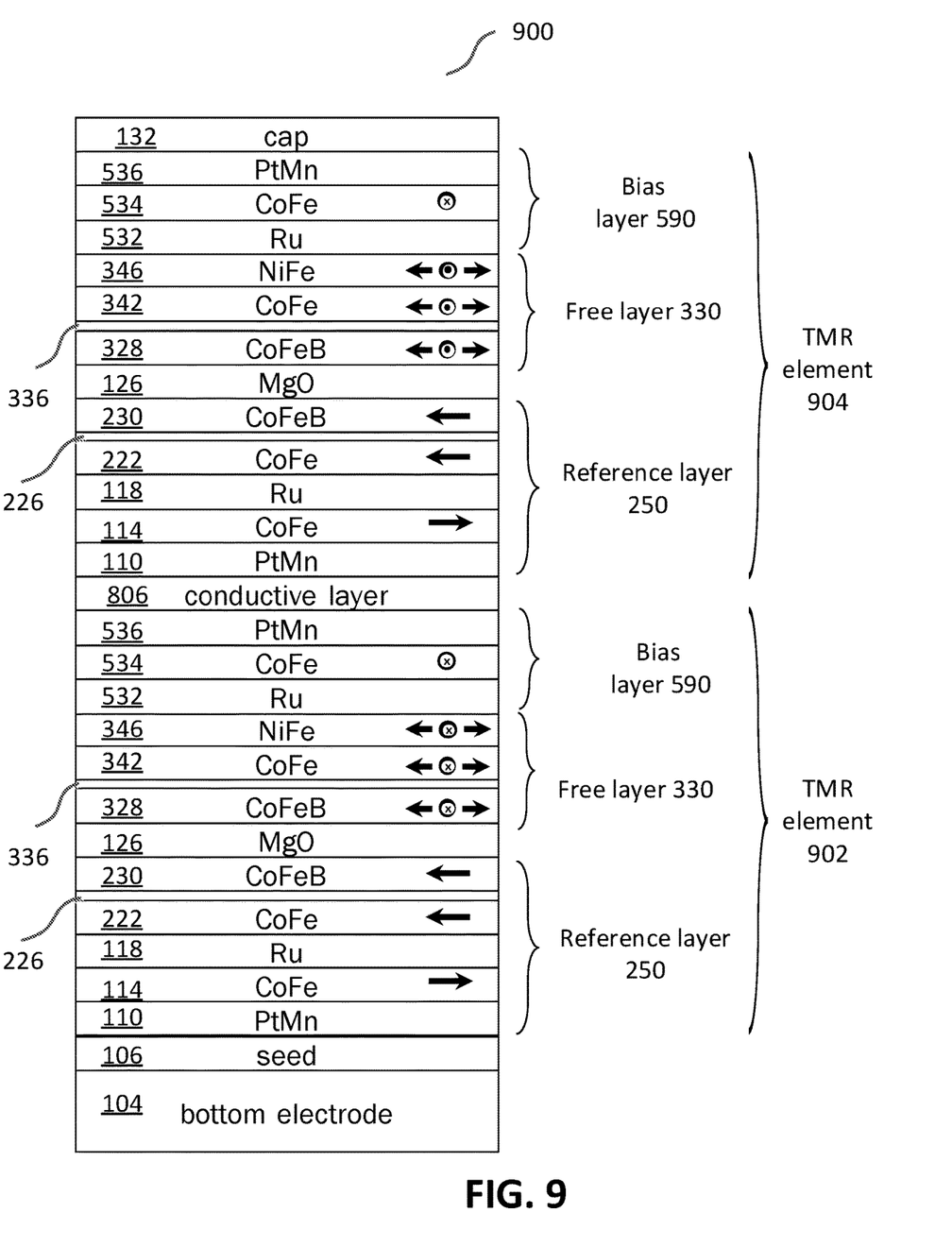
FIG. 9 is a block diagram of another example of a dual TMR element structure having a conducting layer.

Referring to FIG. 9, a dual TMR element structure 900 includes a TMR element 902 and a TMR element 904. In the dual TMR element structure 900 the techniques described in FIGS. 2 to 4 and 6 are applied to the dual TMR element structure 800 (FIG. 8). For example, the free layers 530 (FIG. 8) are each replaced with the free layer 330 (FIG. 3) and the reference layers 150 (FIG. 8) are each replaced with the reference layer 250 (FIG. 2), and the result is the TMR elements 902, 904 each include the bias layer 590 on the top, the free layer 330 in the middle and the reference layer 250 on the bottom.

Figure 10:
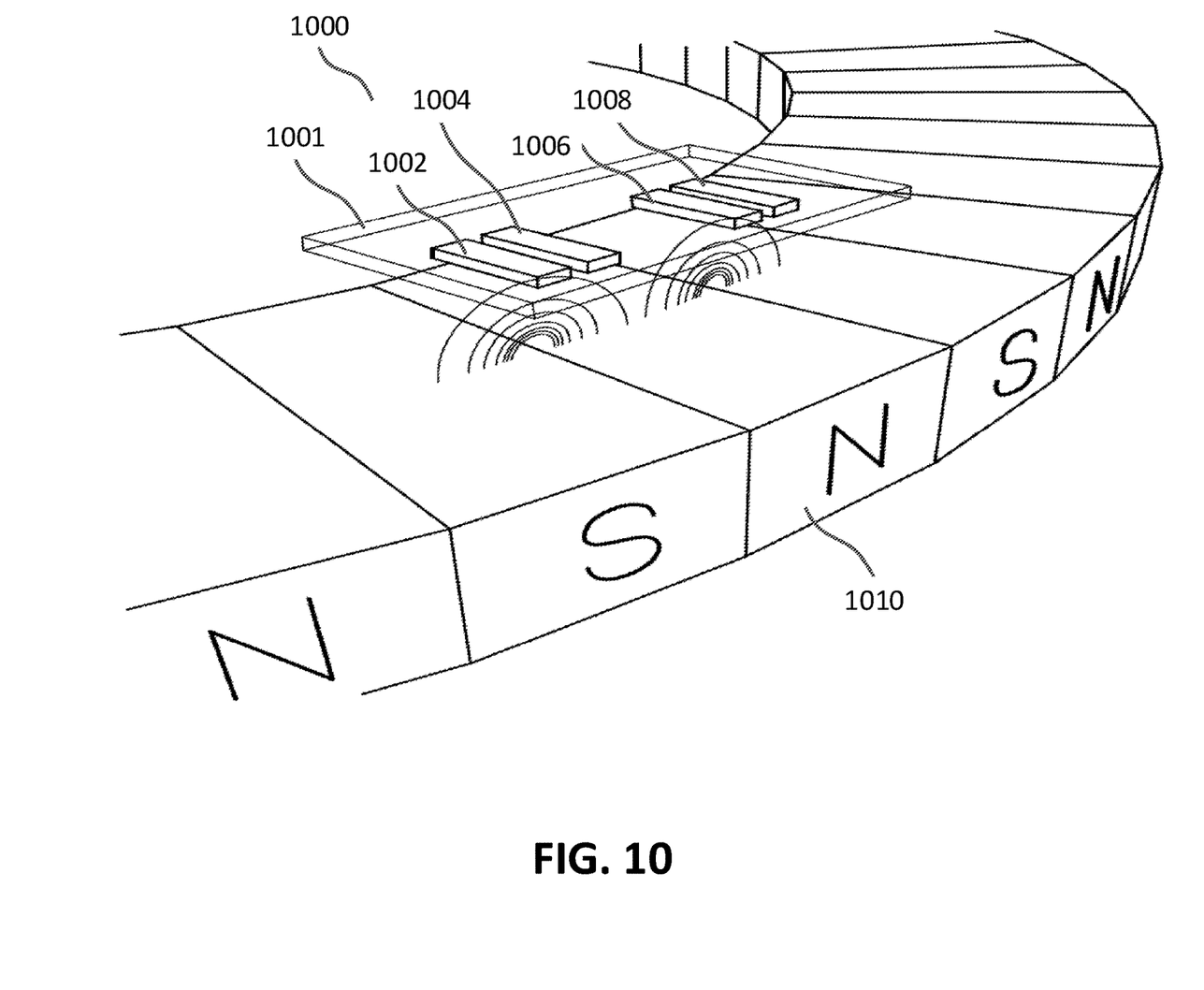
FIG. 10 is a diagram of an example of a magnetic sensor having dual TMR element structures.

Referring to FIG. 10, an example magnetic field sensor 1000 including a plurality of TMR element structures (here, four TMR element structures 1002, 1004, 1006, 1008) is shown. The TMR element structures 1002, 1004, 1006, 1008, which can be the same as or similar to TMR element structures described in connection with figures above (e.g., the dual TMR element structure 800 shown in FIG. 8 and the dual TMR element structure 900 shown in FIG. 9). Additionally, in embodiments, the TMR element structures 1002, 1004, 1006, 1008 can be coupled in bridge arrangements. It is understood that other configurations of the TMR element structures 1002, 1004, 1006, 1008 are, of course, possible. Additionally, it is understood that other electronic components (not shown), for example, amplifiers, analog-to-digital converters (ADC), and processors, i.e., an electronic circuit, can be disposed over the substrate 1001 and coupled to one or more of the TMR element structures 1002, 1004, 1006, 1008, for example, to process signals (i.e., magnetic field signals) produced by the TMR element structures 1002, 1004, 1006, 1008.

In the illustrated embodiment, the magnetic field sensor 1000 is disposed proximate to a moving magnetic object, for example, a ring magnet 1010 having alternative north and south magnetic poles. The ring magnet 1010 is subject to motion (e.g., rotation) and the TMR element structures 1002, 1004, 1006, 1008 of the magnetic field sensor 1000 may be oriented such that maximum response axes of the TMR element structures 1002, 1004, 1006, 1008 are aligned with a magnetic field (e.g., an applied magnetic field) generated by the ring magnet 1010. In embodiments, the maximum responses axes of the TMR element structures 1002, 1004, 1006, 1008 may also be aligned with a magnetic field (e.g., a local magnetic field) generated by a magnet (not shown) disposed proximate to or within the magnetic field sensor 1000. With such a back-biased magnet configuration, motion of the ring magnet 1010 can result in variations of the magnetic field sensed by the TMR element structures 1002, 1004, 1006, 1008.

In embodiments, the TMR element structures 1002, 1004, 1006, 1008 are driven by a voltage source and configured to generate one or more magnetic field signals in response to motion of the ring magnet 1010, e.g., in a first direction of motion and in a second direction of motion that is different than the first direction of motion. Additionally, in embodiments, one or more electronic components (e.g., an ADC) (not shown) on the magnetic field sensor 1000 are coupled to receive the magnetic fields signals and configured to generate an output signal indicative of position, proximity, speed and/or direction of motion of the ring magnet 1010, for example. In some embodiments, the ring magnet 1010 is coupled to a target object, for example, a cam shaft in an engine, and a sensed speed of motion of the ring magnet 1010 is indicative of a speed of motion of the target object. The output signal (e.g., an output voltage) of the magnetic field sensor 1000 generally has a magnitude related to a magnitude of the magnetic field experienced by the TMR element structures 1002, 1004, 1006, 1008.

Additionally, in embodiments in which the TMR element structures 1002, 1004, 1006, 1008 are provided as TMR element structures according to the disclosure (the dual TMR element structure 800 shown in FIG. 8 and the dual TMR element structure 900 shown in FIG. 9), and the magnetic field sensor 1000 includes electronic components (e.g., ADCs) coupled to receive magnetic field signals from the TMR element structures 1002, 1004, 1006, 1008 and configured to generate the output signal of the magnetic field sensor 1000, operational requirements of the electronic components (e.g., so-called "front end electronics" or "signal processing electronics") may, for example, be reduced in comparison to embodiments in which the magnetic field sensor 1000 includes conventional magnetoresistance elements.

While the magnetic field sensor 1000 is shown and described as a motion detector to motion rotation of the ring magnet 1010 in the illustrated embodiment, it is understood that other magnetic field sensors, for example, current sensors, may include one or more of the TMR element structures according to the disclosure.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A dual tunnel magnetoresistance (TMR) element structure, comprising:
   a first TMR element;
   a second TMR element; and
   an electrically conducting layer disposed between the first TMR element and the second TMR element and in direct contact with the first TMR element and the second TMR element,
   wherein the first TMR element or the second TMR element comprises:
      a first bias layer comprising:
         a first platinum manganese layer;
         a first cobalt iron layer in direct contact with the first PtMn layer of the first bias layer; and
         a first ruthenium layer in direct contact with the first CoFe layer of the first bias layer;
      a first free layer in direct contact with the first bias layer, the first free layer comprising:
         a nickel iron layer in direct contact with the first Ru layer of the first bias layer;
         a second CoFe layer in direct contact with the NiFe layer of the first free layer;
         a first tantalum layer in direct contact with the second CoFe layer of the first free layer; and
         a first cobalt iron boron in direct contact with the first Ta layer of the first free layer;
      a first magnesium oxide MgO layer in direct contact with the first CoFeB layer of the first free layer;
      a first reference layer in direct contact with the first MgO layer, the first reference layer comprising:

a second CoFeB layer in direct contact with the first MgO layer;
a third CoFe layer in direct contact with a second Ta layer;
the second Ta layer in direct contact with the second CoFeB layer of the first reference layer and the third CoFe layer of the first reference layer;
a second Ru layer in direct contact with the third CoFe layer of the first reference layer;
a fourth CoFe layer in direct contact with the second Ru layer of the first reference layer; and
a second PtMn layer in direct contact with the fourth CoFe layer of the first reference layer.

2. The dual TMR element structure of claim 1, wherein the second CoFe layer and/or the first CoFeB layer is 1.0 nanometer thick.

3. The dual TMR element structure of claim 1, wherein the second CoFeB layer and/or the third CoFe layer is 0.9 nanometers thick.

4. The dual TMR element structure of claim 1, wherein the first and/or second Ta layer is 0.1 nanometers thick.

5. The dual TMR element structure of claim 1, wherein a thickness of the first and/or second Ta layer is between 0.05 nanometers and 0.3 nanometers.

6. The dual TMR element structure of claim 1, wherein the second CoFeB layer is 0.9 nanometers thick,
wherein the third CoFe layer is 0.9 nanometers thick,
wherein the first CoFeB layer is 1.0 nanometer thick, and
wherein the second CoFe layer is 1.0 nanometer thick.

7. The dual TMR element structure of claim 6, wherein the first and/or second tantalum layer is 0.1 nanometers thick.

8. The dual TMR element structure of claim 6, wherein a thickness of the first and/or second tantalum layer is between 0.05 nanometers and 0.3 nanometers.

9. The dual TMR element structure of claim 1, wherein at least one of the first TMR element or the second TMR element is single pinned.

10. The dual TMR element structure of claim 1, wherein at least one of the first TMR element or the second TMR element is double pinned.

11. The dual TMR element structure of claim 1, wherein the first TMR element has a higher sensitivity to a magnetic field than the second TMR element.

12. The dual TMR element structure of claim 1, wherein, with a changing magnetic field, the first TMR element has an increasing sensitivity to the magnetic field and the second TMR element has a decreasing sensitivity to the magnetic field.

13. A magnetic field sensor, comprising:
at least one dual tunnel magnetoresistance (TMR) element structure, comprising:
a first TMR element;
a second TMR element; and
an electrically conducting layer disposed between the first TMR element and the second TMR element and in direct contact with the first TMR element and the second TMR element,
wherein the first TMR element or the second TMR element comprises:
a first bias layer comprising:
a first platinum manganese layer;
a first cobalt iron layer in direct contact with the first PtMn layer of the first bias layer; and
a first ruthenium layer in direct contact with the first CoFe layer of the first bias layer;
a first free layer in direct contact with the first bias layer, the first free layer comprising:
a nickel iron layer in direct contact with the first Ru layer of the first bias layer;
a second CoFe layer in direct contact with the NiFe layer of the first free layer;
a first tantalum layer in direct contact with the second CoFe layer of the first free layer; and
a first cobalt iron boron in direct contact with the first Ta layer of the first free layer;
a first magnesium oxide MgO layer in direct contact with the first CoFeB layer of the first free layer;
a first reference layer in direct contact with the first MgO layer, the first reference layer comprising:
a second CoFeB layer in direct contact with the first MgO layer;
a third CoFe layer in direct contact with a second Ta layer;
the second Ta layer in direct contact with the second CoFeB layer of the first reference layer and the third CoFe layer of the first reference layer;
a second Ru layer in direct contact with the third CoFe layer of the first reference layer;
a fourth CoFe layer in direct contact with the second Ru layer of the first reference layer; and
a second PtMn layer in direct contact with the fourth CoFe layer of the first reference layer.

14. The magnetic field sensor of claim 13, wherein the first TMR element has a higher sensitivity to a magnetic field than the second TMR element.

15. The dual TMR element structure of claim 13, wherein, with a changing magnetic field, the first TMR element has an increasing sensitivity to the magnetic field and the second TMR element has a decreasing sensitivity to the magnetic field.

16. The dual TMR element structure of claim 1, wherein the first TMR element comprises the first bias layer, the first free layer, the first MgO layer and the first reference layer and
wherein the second TMR element comprises:
a second bias layer comprising:
a first PtMn layer;
a first CoFe layer in direct contact with the first PtMn layer of the second bias layer; and
a first Ru layer in direct contact with the first CoFe layer of the second bias layer;
a second free layer in direct contact with the second bias layer, the second free layer comprising:
a NiFe layer in direct contact with the first Ru layer of the second bias layer;
a second CoFe layer in direct contact with the NiFe layer of the second free layer;
a first Ta layer in direct contact with the second CoFe layer of the second free layer; and
a first CoFeB in direct contact with the first Ta layer of the second free layer;
a second MgO layer in direct contact with the first CoFeB layer of the second free layer;
a second reference layer in direct contact with the second MgO layer, the second reference layer comprising:
a second CoFeB layer in direct contact with the second MgO layer;
a third CoFe layer in direct contact with a second Ta layer;

the second Ta layer in direct contact with the second CoFeB layer of the second reference layer and the third CoFe layer of the second reference layer;

a second Ru layer in direct contact with the third CoFe layer of the second reference layer;

a fourth CoFe layer in direct contact with the second Ru layer of the second reference layer; and a second PtMn layer in direct contact with the fourth CoFe layer of the second reference layer.

17. The dual TMR element structure of claim 16, wherein the first reference layer is in direct contact with the electrically conducting layer.

18. The dual TMR element structure of claim 17, further comprising a cap layer.

19. The dual TMR element structure of claim 18, wherein the first bias layer is in direct contact with the cap layer.

20. The dual TMR element structure of claim 17, wherein the second bias layer is in direct contact with the electrically conducting layer.

21. The dual TMR element structure of claim 20, further comprising a seed layer.

22. The dual TMR element structure of claim 21, wherein the second reference layer is in direct contact with the seed layer.

23. The dual TMR element structure of claim 16, wherein the second CoFe layer of the second free layer and/or the first CoFeB layer of the second free layer is 1.0 nanometer thick.

24. The dual TMR element structure of claim 16, wherein the second CoFeB layer of the second reference layer and/or the third CoFe layer of the second reference layer is 0.9 nanometers thick.

25. The dual TMR element structure of claim 16, wherein the first Ta layer of the first free layer and/or second Ta layer of the second reference layer is 0.1 nanometers thick.

26. The dual TMR element structure of claim 16, wherein a thickness of the first Ta layer of the first free layer and/or second Ta layer of the second reference layer is between 0.05 nanometers and 0.3 nanometers.

27. The dual TMR element structure of claim 16, wherein the second CoFeB layer of the second reference layer is 0.9 nanometers thick, wherein the third CoFe layer of the second reference layer is 0.9 nanometers thick, wherein the first CoFeB layer of the second free layer is 1.0 nanometer thick, wherein the second CoFe layer of the second free layer is 1.0 nanometer thick, and wherein a thickness of the first and/or second tantalum layer is between 0.05 nanometers and 0.3 nanometers.

* * * * *

UNITED STATES PATENT AND TRADEMARK OFFICE
CERTIFICATE OF CORRECTION

PATENT NO. : 11,217,626 B2  
APPLICATION NO. : 16/684932  
DATED : January 4, 2022  
INVENTOR(S) : Paolo Campiglio et al.

Page 1 of 1

It is certified that error appears in the above-identified patent and that said Letters Patent is hereby corrected as shown below:

In the Specification

Column 2, Line 67 delete "layer CoFeB 122." and replace with --CoFeB layer 122.--.

Column 3, Line 48 delete "(NiFe) 346" and replace with --(NiFe) layer 346--.

Column 3, Line 49 delete "CoFeb 328" and replace with --CoFeB layer 328--.

Column 3, Line 52 delete "CoFeB 328" and replace with --CoFeB layer 328--.

Column 3, Line 53 delete "CoFe 342" and replace with --CoFe layer 342--.

Column 3, Line 55 delete "CoFeB 328" and replace with --CoFeB layer 328--.

Column 3, Line 66 delete "CoFeB 528" and replace with --CoFeB layer 528--.

Column 4, Line 1 delete "CoFe layer" and replace with --CoFe layer 534--.

Column 5, Line 49 delete "responses" and replace with --response--.

Signed and Sealed this  
Seventh Day of February, 2023

Katherine Kelly Vidal  
*Director of the United States Patent and Trademark Office*